United States Patent
Strachan

(10) Patent No.: US 6,646,320 B1
(45) Date of Patent: Nov. 11, 2003

(54) METHOD OF FORMING CONTACT TO POLY-FILLED TRENCH ISOLATION REGION

(75) Inventor: Andrew Strachan, Santa Clara, CA (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 10/301,183

(22) Filed: Nov. 21, 2002

(51) Int. Cl.[7] ................................................ H01L 29/00
(52) U.S. Cl. ........................ 257/514; 257/515; 257/517; 257/518; 257/523; 257/526
(58) Field of Search ................................. 257/514, 515, 257/517, 518, 520, 523, 526, 527, 524, 510

(56) References Cited

U.S. PATENT DOCUMENTS 4,745,081 A  *  5/1988  Beyer et al. ................. 438/429
5,569,621 A  * 10/1996  Yallup et al. ................ 438/404
2002/0179976 A1 * 12/2002  Takahashi ................... 257/370
2003/0102486 A1 *  6/2003  Inoue et al. ................. 257/139

* cited by examiner

Primary Examiner—Nathan J. Flynn
Assistant Examiner—Pershelle Greene
(74) Attorney, Agent, or Firm—Stallman & Pollock LLP

(57) ABSTRACT

Existing polysilicon emitter technology is used to contact poly fill in a trench isolation structure. A standard single poly emitter window process is followed. An "emitter window" is masked directly over the polysilicon trench fill. Heavily doped single emitter poly is deposited and masked over the entire active region. The standard emitter drive then diffuses dopant through the emitter window into the undoped trench poly fill to provide an ohmic contact between the emitter poly and the trench poly fill. Contact to the emitter poly is made from overlying metal.

17 Claims, 2 Drawing Sheets

US 6,646,320 B1

METHOD OF FORMING CONTACT TO POLY-FILLED TRENCH ISOLATION REGION

TECHNICAL FIELD OF THE INVENTION

The present invention relates to the manufacture of semiconductor integrated circuits and, in particular, to a method of forming a reliable ohmic contact to a polysilicon filled trench isolation region in a single poly bipolar or bi-CMOS process.

BACKGROUND OF THE INVENTION

Deep trench isolation is used in many bipolar and bi-CMOS process technologies. As shown in FIG. 1, this isolation technique utilizes a deep trench 10 etched into a silicon substrate 12 that is lined with thin silicon oxide 14 and then filled with undoped polysilicon 16. The poly filled trench is then capped with field oxide 18. For the typical application of isolation, the undoped polysilicon fill 16 is left electrically floating by interposing dielectric material 20 between the poly fill 16 and the overlying metal interconnect structure 22 of the integrated circuit.

There may be applications in which a contact to the undoped polysilicon fill region 16 of the isolation structure is desirable As shown in FIG. 2, the simplest way to form this contact is to cut a via in the dielectric material 20 and form a metal contact 22 down to the polysilicon fill 16. Those skilled in the art will appreciate that, depending on the topology of the device structure, the contact 22a may be formed as part of the formation of the metal layer 22 itself or as separate plug, e.g. tungsten, prior to formation of the metal layer 22.

However, the formation of the contact 22a may present several problems. For example, the metal contact 22a may form a schottky diode with the undoped polysilicon fill region 16, rather than the desired ohmic contact. Also, the contact could be made on an active (non-field) region and this would not be compatible with modern silicided processes in that the silicide from the active region could short across the oxide liner to the exposed trench fill.

SUMMARY OF THE INVENTION

In an embodiment of a method of fabricating an isolation structure in a semiconductor integrated circuit in accordance with the present invention, a trench is formed in a semiconductor substrate and lined with dielectric material. The lined trench is then filled with undoped polysilicon. A layer of dielectric material is then formed over an upper surface of the polysilicon filled lined trench and an opening is formed in the layer of second dielectric material to expose an upper surface of the undoped polysilicon. A layer of heavily doped polysilicon is then formed over the dielectric material and extending into the opening formed in the dielectric material such that the layer of doped polysilicon is in contact with an upper surface of the undoped polysilicon. A heat treatment step then causes dopant from the doped polysilicon to diffuse into the undoped polysilicon that fills the trench, thereby creating an ohmic contact between the doped polysilicon and the undoped polysilicon. A patterned layer of dielectric material is then formed over the doped polysilicon and an opening is formed in the dielectric material. A layer of conductive material is then formed over the dielectric material to extend into the opening to make electrical contact with the doped polysilicon.

In a preferred embodiment of the invention, these steps are carried out in the implementation of a bipolar process or a bi-CMOS process.

The features and advantages of the present invention will be more fully appreciated upon consideration of the following detailed description and the accompanying drawings which set forth an illustrative embodiment in which the principles of the invention are utilized.

DETAILED DESCRIPTION OF THE INVENTION

A preferred embodiment of the present invention provides a technique for using an existing polysilicon emitter architecture to form a contact to a trench poly fill.

As is well known in the art, conventional processes for fabricating bipolar transistors, either in a strictly bipolar process or in a combined bipolar-CMOS (bi-CMOS) process, include a module in which a layer of silicon oxide is formed over the substrate base region of the bipolar device; the oxide is then etched to provide an "emitter window" opening in the oxide to expose a portion of the base region. A doped emitter polysilicon region is formed over the oxide and extending into the emitter window, and in a subsequent heat treatment step, dopant is driven from the doped poly emitter into the substrate base region to provide an ohmic base/emitter contact for the bipolar device.

This inherent flow of the bipolar fabrication process is exploited in accordance with the concepts of the present invention to provide an ohmic contact to the trench poly fill material in a poly filled trench isolation region in a bipolar or bi-CMOS integrated circuit structure.

Figure 1:
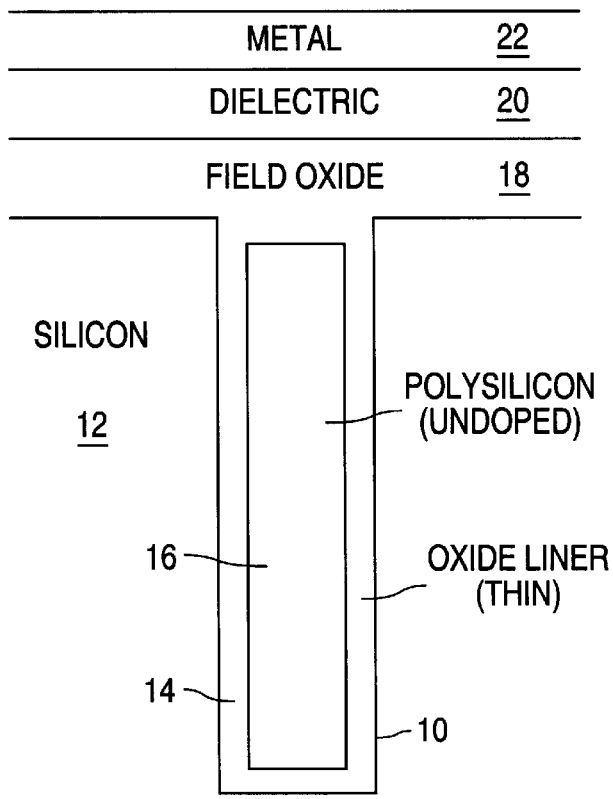
FIG. 1 is a partial cross-section drawing illustrating a conventional deep trench isolation structure.
Figure 2:
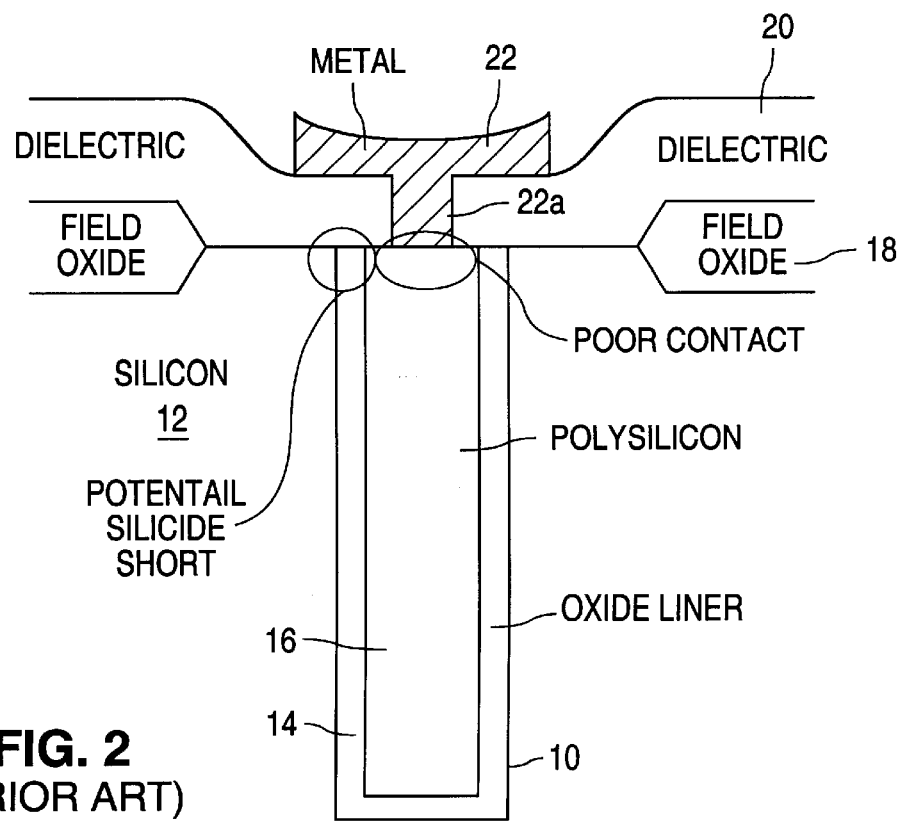
FIG. 2 is a partial cross-section drawing illustrating a metal contact to a conventional deep trench isolation structure.
Figure 3:
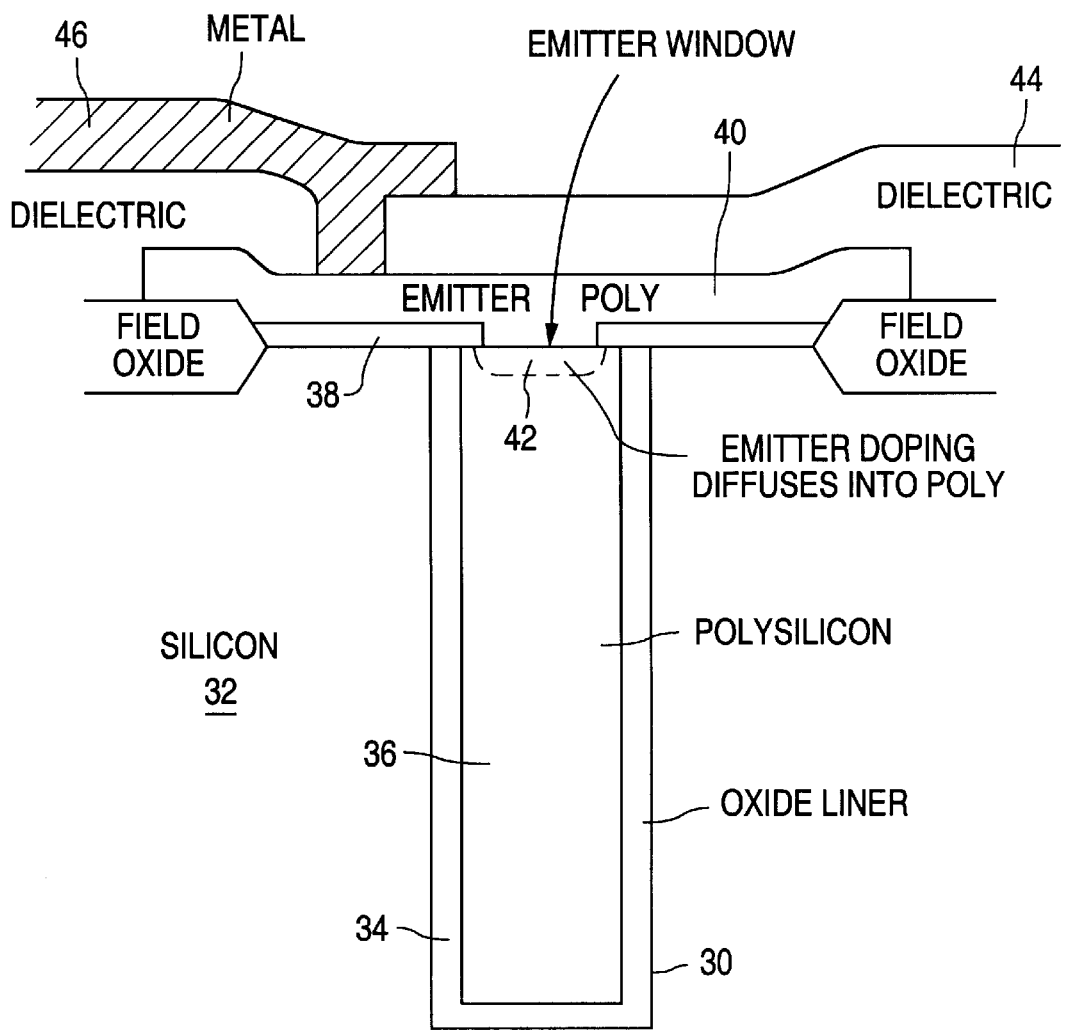
FIG. 3 is a partial cross-section drawing illustrating a method of forming a contact to a poly-filled trench isolation region in accordance with the concepts of the present invention.

Referring to FIG. 3, in an embodiment of a method in accordance with the present invention, a trench 30 is formed in a silicon substrate, lined with thin silicon oxide 34 and filled with undoped polysilicon 36, all in the conventional manner. Then, when the standard single poly emitter window process module is implemented for the formation of bipolar devices in the integrated circuit structure, a layer of silicon oxide 38 is formed over the planarized (e.g. CMP) trench region. An "emitter window" is then masked and etched in the silicon oxide 38 directly over the polysilicon trench fill 36. The single emitter polysilicon 40 is then deposited, masked and etched over the entire device region, resulting in formation of patterned emitter poly 40 in contact with the undoped poly fill material 16 through the "emitter window" in the oxide 38. The emitter poly 40 is heavily doped (either n or p type) by a standard emitter implant (or other conventional technique for doping emitter poly). The standard emitter drive then causes dopant in the emitter poly 40 to diffuse through the emitter window into the undoped trench poly fill 16. This dopant will not dope the entire poly fill 16, but provides an ohmic contact region 42 between the emitter poly 40 and the trench poly fill 16.

Following these steps, a standard contact to the emitter poly is formed, For example, as shown in FIG. 3, a layer of dielectric material 44 is formed over the patterned emitter poly 40, a via is etched in the dielectric material 44 and a layer 46 of metal is formed to create a metal contact 46 between the emitter poly 40 and the metal layer 46. Since this is a contact between metal (e.g, Al) 46 and heavily doped emitter poly 40, it also is an ohmic contact. Also, since the active region surrounding the trench is completely covered by emitter poly 40, there is no chance of silicide shorting the structure as with the conventional method. Using this procedure, the polysilicon fill 36 in the isolation trench 30 is contacted and can be independently biased.

As stated above, this method uses only standard process steps for a single poly bipolar process and avoids the disadvantage listed above with respect to prior art techniques.

It should be recognized that a number of variations of the above-identified embodiments of the invention will be obvious to one skilled in the art in view of the foregoing description. Accordingly, the invention is not to be limited by those specific embodiments and methods of the present invention shown and described herein. Rather, the scope of the invention is to be defined by the following claims and their equivalents.

What is claimed is:

1. A method of fabricating an isolation structure in a semiconductor integrated circuit structure, the method comprising:

forming a trench in a semiconductor substrate;

lining the trench with first dielectric material;

filling the lined trench with undoped polysilicon;

forming a layer of second dielectric material over an upper surface of the polysilicon filled lined trench;

forming an opening in the layer of second dielectric material to expose an upper surface of the undoped polysilicon;

forming a layer of doped polysilicon over the layer of second dielectric material and extending into the opening formed in the layer of second dielectric material such that the layer of doped polysilicon is in contact with the upper surface of the undoped polysilicon;

forming a patterned layer of third dielectric material over the layer of doped polysilicon such that the layer of third dielectric material has an opening formed therein to expose an upper surface region of the layer of doped polysilicon; and forming a layer of conductive material over the layer the third dielectric material and extending into the opening formed in the layer of third dielectric material such that the layer of conductive material is in contact with an upper surface of the layer of doped polysilicon.

2. A method as in claim 1, and wherein the semiconductor substrate comprises silicon.

3. A method as in claim 2, and wherein the first dielectric material comprises silicon oxide.

4. A method as in claim 3, and wherein the second dielectric material comprises silicon oxide.

5. A method as in claim 4, and wherein the third dielectric material comprises silicon oxide.

6. A method as in claim 5, and wherein the conductive material comprises a metal.

7. A method as in claim 6, and wherein the metal comprises aluminum.

8. A method of fabricating an insulation structure in a semiconductor integrated circuit structure utilizing steps of a process for fabricating a bipolar transistor structure, the method comprising:

forming a trench in a silicon substrate;

lining the trench with first silicon oxide;

filling the oxide lined trench with undoped polysilicon;

forming a layer of second silicon oxide over an upper surface of the polysilicon filled lined trench;

forming an opening in the layer of second silicon oxide to expose an upper surface of the undoped polysilicon;

forming a layer of doped polysilicon over the layer of second silicon oxide and extending into the opening formed in the layer of second silicon oxide such that the layer of doped polysilicon is in contact with the upper surface of the undoped polysilicon;

heating the layer of the doped polysilicon such that dopant contained in the layer of doped polysilicon diffuses to an upper surface region of the undoped polysilicon to form an ohmic contact between the layer of doped polysilicon and the undoped polysilicon;

forming a patterned layer of third silicon oxide over the layer of doped polysilicon such that the layer of third silicon oxide has an opening formed therein to expose an upper surface region of the layer of doped polysilicon; and forming a layer of conductive material over the layer of third silicon oxide and extending into the opening formed in the layer of third silicon oxide such that the layer of conductive material is in contact with an upper surface of the layer of doped polysilicon.

9. A method as in claim 8, and wherein the conductive material comprises metal.

10. A method as in claim 9, and wherein the metal comprises a first metal plug formed in the opening in the layer of third silicon oxide and an overlying layer of a second metal formed on an upper surface of the third silicon oxide and in electrical contact with the first metal plug.

11. A method as in claim 10, and wherein the first metal comprises tungsten and the second metal comprises aluminum.

12. An isolation structure formed in a semiconductor integrated circuit structure, the isolation structure comprising:

a trench formed in a semiconductor substrate;

a liner of first dielectric material formed on exposed surfaces of the trench;

undoped polysilicon disposed within the lined trench to fill the lined trench;

a layer of second dielectric material formed over an upper surface of the polysilicon filled lined trench, the layer of second dielectric material having an opening formed therein to expose an upper surface of the undoped polysilicon;

a layer of doped polysilicon formed over the layer of second dielectric material and extending into the opening formed in the layer of second dielectric material such that the layer of doped polysilicon is in contact with the upper surface of the undoped polysilicon;

a patterned layer of third dielectric material formed over the layer of doped polysilicon such that the layer of third dielectric material has an opening formed therein to expose an upper surface region of the layer of doped polysilicon; and a layer of conductive material formed over the layer of third dielectric material and extending into the opening formed in a layer of third dielectric material such that the layer of conductive material is in contact with an upper surface of the layer of third dielectric material.

13. An isolation structure as in claim 12, and wherein the semiconductor substrate comprises silicon.

14. An isolation structure as in claim 13, and wherein the first dielectric material comprises silicon oxide.

15. An isolation structure as in claim 14, and wherein the second dielectric material comprises silicon oxide.

16. An isolation structure as in claim 15, and wherein the third dielectric material comprises silicon oxide.

17. An isolation structure as in claim 16, and wherein the conductive material comprises a metal.

* * * * *